US00RE44981E

(19) United States
(12) Reissued Patent
Ye et al.

(10) Patent Number: US RE44,981 E
(45) Date of Reissued Patent: Jul. 1, 2014

(54) METHOD FOR SUPER-RESOLUTION RECONSTRUCTION USING FOCAL UNDERDETERMINED SYSTEM SOLVER ALGORITHM

(71) Applicant: Samsung Electronics Co., Ltd., Gyeonggi-do (KR)

(72) Inventors: Jong-Chul Ye, Daejeon (KR); Hong Jung, Seoul (KR); Jaeheung Yoo, Seoul (KR); Sung-ho Tak, Seoul (KR)

(73) Assignee: Samsung Electronics Co., Ltd., Yeongtong-gu, Suwon-si, Gyeonggi-do (KR)

(21) Appl. No.: 13/738,397

(22) Filed: Jan. 10, 2013

Related U.S. Patent Documents

Reissue of:
(64) Patent No.: 7,881,511
Issued: Feb. 1, 2011
Appl. No.: 11/823,633
Filed: Jun. 28, 2007

(30) Foreign Application Priority Data

Jan. 19, 2007 (KR) ..... 10-2007-0005906
Jan. 24, 2007 (KR) ..... 10-2007-0007568

(51) Int. Cl.
*G06K 9/00* (2006.01)
*G06K 9/32* (2006.01)

(52) U.S. Cl.
USPC ..... 382/128; 382/298

(58) Field of Classification Search
USPC ..... 382/128–132, 298–300
See application file for complete search history.

(56) References Cited

U.S. PATENT DOCUMENTS

| | | | | |
|---|---|---|---|---|
| 5,666,215 | A * | 9/1997 | Fredlund et al. | 358/487 |
| 5,856,832 | A * | 1/1999 | Pakenham et al. | 345/540 |
| 5,875,268 | A | 2/1999 | Miyake | |
| 6,038,257 | A | 3/2000 | Brusewitz et al. | |
| 6,175,592 | B1 * | 1/2001 | Kim et al. | 375/240.16 |
| 6,184,935 | B1 * | 2/2001 | Iaquinto et al. | 348/441 |
| 6,233,279 | B1 * | 5/2001 | Boon | 375/240.08 |
| 6,766,067 | B2 * | 7/2004 | Freeman et al. | 382/299 |
| 6,788,347 | B1 * | 9/2004 | Kim et al. | 348/441 |
| 7,020,319 | B2 * | 3/2006 | Mertelmeier et al. | 382/132 |
| 7,151,801 | B2 | 12/2006 | Grossberg et al. | |
| 7,447,382 | B2 * | 11/2008 | Nestares et al. | 382/299 |
| 7,545,965 | B2 * | 6/2009 | Suzuki et al. | 382/128 |
| 2007/0019887 | A1 * | 1/2007 | Nestares et al. | 382/299 |
| 2008/0095450 | A1 * | 4/2008 | Kirenko | 382/232 |
| 2009/0182220 | A1 * | 7/2009 | Blunt et al. | 600/409 |

OTHER PUBLICATIONS

Wu et al., IEEE Publication, 2003., "A Computer simulation system of the electric activity in brains" (pp. 990-993).*
Zwart et al, IEEE Publication, 2002, "Optimization of a high sensitivity MRI receive coil for parallel human brain imaging" (pp. 966-969).*
Dong et al., IEEE Publication, 2006, "EIT Images with Improved Spatial Resolution Using a Realistic Head Model" (pp. 1134-1136).*

* cited by examiner

*Primary Examiner* — Manav Seth
(74) *Attorney, Agent, or Firm* — Cha & Reiter, LLC

(57) ABSTRACT

Disclosed is a high-resolution image reconstruction method using a focal underdetermined system solver (FOCUSS) algorithm. The method comprises the steps of: outputting data for an image of an object; downsampling the outputted data; transforming the downsampled data into low-resolution image frequency data; and reconstructing a high-resolution image from the transformed low-resolution image frequency data by applying focal underdetermined system solver (FOCUSS) algorithm.

42 Claims, 2 Drawing Sheets

METHOD FOR SUPER-RESOLUTION RECONSTRUCTION USING FOCAL UNDERDETERMINED SYSTEM SOLVER ALGORITHM

Matter enclosed in heavy brackets [ ] appears in the original patent but forms no part of this reissue specification; matter printed in italics indicates the additions made by reissue.

CROSS-REFERENCE TO RELATED APPLICATION

The present application claims, under 35 U.S.C. §119(a), the benefit of Korean Patent Application Nos. 10-2007-0005906, filed Jan. 19, 2007 and 10-2007-0007568 filed Jan. 19 24, 2007, the entire contents of which are hereby incorporated by reference.

BACKGROUND OF THE INVENTION

1. Technical Field

The present invention relates a method for obtaining high resolution images using a magnetic resonance imaging (MRI) device. More particularly, the present invention relates to a method for obtaining high resolution MRI images by using a sparse reconstruction algorithm.

2. Background Art

In MRI, atomic nuclei are located in a strong magnetic field so as to cause a precession of the atomic nuclei. When a high-frequency signal is applied to the atomic nuclei which are magnetized by a magnetic field generated by the precession, the atomic nuclei are excited into a high energy state. In this state, when the high-frequency signal is removed, the atomic nuclei emit high-frequency signals. Then, the magnetic properties of the materials constituting human body are measured from the emitted high-frequency signals, and the materials are reconstructed, thereby making an image.

Particularly, dynamic MRI is a technology for obtaining a moving image by observing and measuring a temporally changing process, such as cerebral blood flow, heart beat, etc.

In general, when data is obtained in a radial shape within k space, the phase encoding gradient is not used, so that the echo time is short, photographing can be performed without being restrained by breathing and blood flow movement, and an aliasing artifact in data downsampled in a radial shape is generated in a line shape, thereby causing relatively less visual confusion.

However, since an output of radial data in k space requires more data than in a Cartesian grid, scan time of the magnetic resonance imaging increases, and a great amount of calculation is required to optimize the size of downsampled data, thereby causing a system overload.

Also, when data is not obtained in a radial or spiral shape but is obtained in the shape of a Cartesian grid, echo time becomes longer due to the use of the phase encoding gradient, so that the data becomes susceptible to movement of a material object. In order to improve time resolution, it is necessary to reduce the echo time by reducing the number of pieces of obtained data. However, in this case also, there is a problem of causing an aliasing artifact in which images are overlapped and displayed according to the Nyquist sampling limit theory.

The information disclosed in this Background of the Invention section is only for enhancement of understanding of the background of the invention and should not be taken as an acknowledgement or any form of suggestion that this information forms the prior art that is already known to a person skilled in the art.

SUMMARY OF THE INVENTION

Accordingly, the present invention has been made to solve the above-mentioned problems of the prior art, and the present invention provides a method of forming a high resolution image using a sparse reconstruction algorithm, the focal underdetermined system solver (FOCUSS) algorithm.

In one aspect, the present invention provides a method for forming a high-resolution image, the method comprising the steps of: (a) outputting data for an image of an object; (b) downsampling the outputted data; (c) transforming the downsampled data into low-resolution image frequency data; and (d) reconstructing a high-resolution image from the transformed low-resolution image frequency data by applying focal underdetermined system solver (FOCUSS) algorithm. The image of an object can be a still image, a moving image, or both.

In a preferred embodiment, when the image is a still image, the outputted data corresponds to projection data obtained by a magnetic resonance imaging scheme, and the outputted data corresponds to radial data, the step (c) may be performed by inverse Radon transformation.

In another preferred embodiment, when the image is a still image and the outputted data corresponds to spiral data, the step (c) may be performed by inverse Fourier transformation.

In yet another preferred embodiment, when the image is a moving image, the method may be performed in k-t space. Preferably, in this embodiment, the step (b) may be performed by obtaining all data in a frequency encoding direction during a predetermined period in a time domain and random-pattern data in a phase encoding direction according to each period. Also preferably, the step (c) may be performed by two-dimensional Fourier transformation.

In a further preferred embodiment, the step (d) may further comprise the steps of: (1) calculating a weighting matrix from the low-resolution image frequency data; (2) calculating image data from the weighting matrix and the low-resolution image frequency data satisfying a predetermined condition; and (3) when the image data is converged the high-resolution image, performing inverse Fourier transformation along a time axis to reconstruct the high-resolution image; or when the image data is not converged, updating the weighting matrix by using a diagonal element of the image data and repeating the step (2) with the updated weighting matrix until the image data is converged to the high-resolution image.

Preferably, in this embodiment, the low-resolution image frequency data satisfying a predetermined condition in the step (2) may be calculated by Lagrangian transformation.

Preferably, in the above embodiment, when a Fourier transform transformed by the Lagrangian transformation is replaced by a Fourier transform applied along a time axis and Radon transformation, the FOCUSS algorithm may be applied with respect to radial data in k or k-t space. The radial data may correspond to downsampled data obtained at a uniform angle.

Also preferably, when the Fourier transform transformed by the Lagrangian transformation is replaced by a Fourier transform applied along a time axis and Radon transformation, the FOCUSS algorithm may be applied with respect to spiral data in k or k-t space. The spiral data may correspond to downsampled data obtained at a uniform angle.

In yet a further preferred embodiment, the updating of weighting matrix in the step (3) may be performed by applying a power factor to absolute value of the diagonal element. Preferable range of the power factor is 0.5 to 1.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Figure 1:
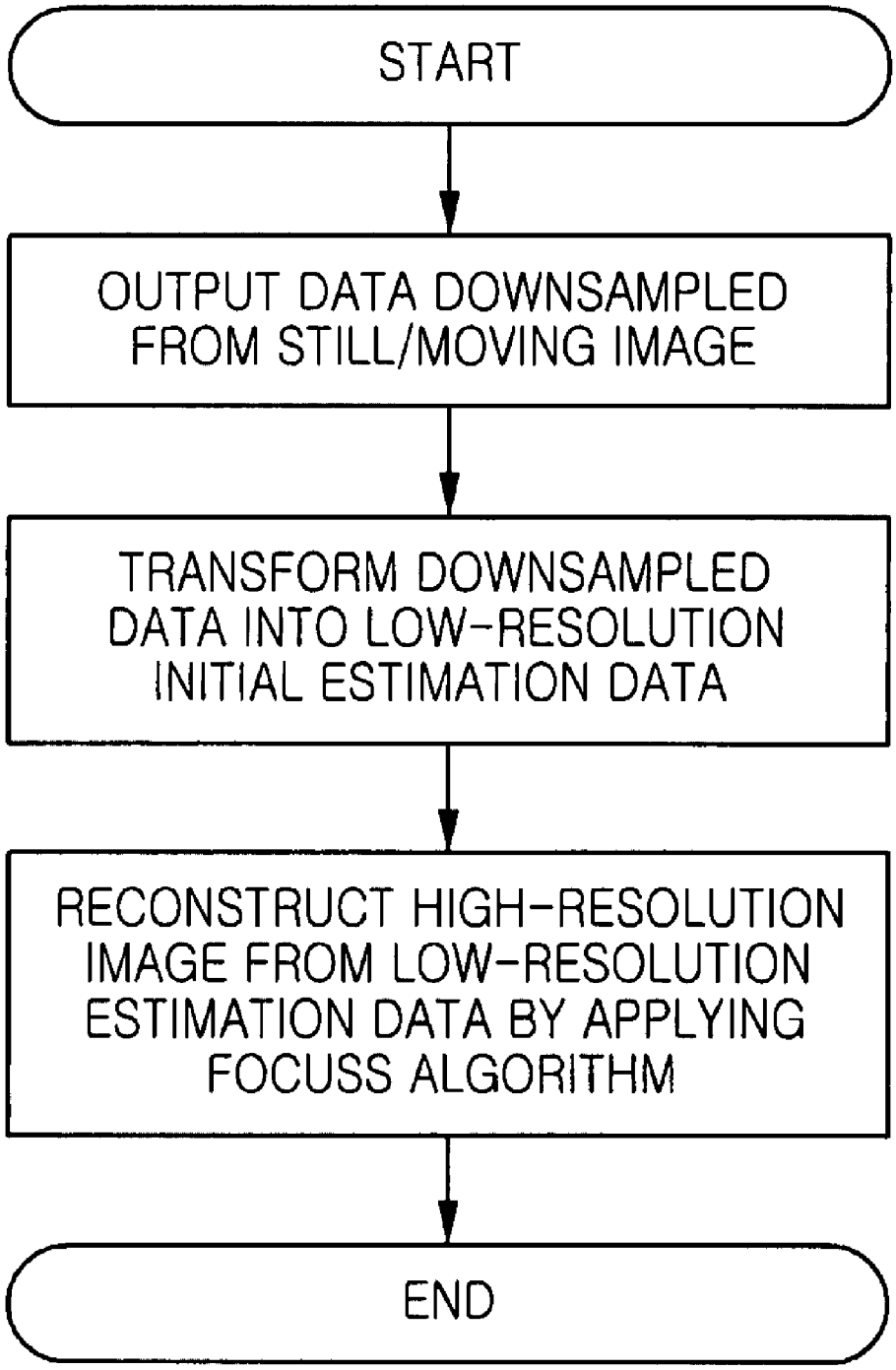
FIG. 1 is a flowchart schematically illustrating a still/moving image reconstruction method using the FOCUSS algorithm according to the present invention.
Figure 2:
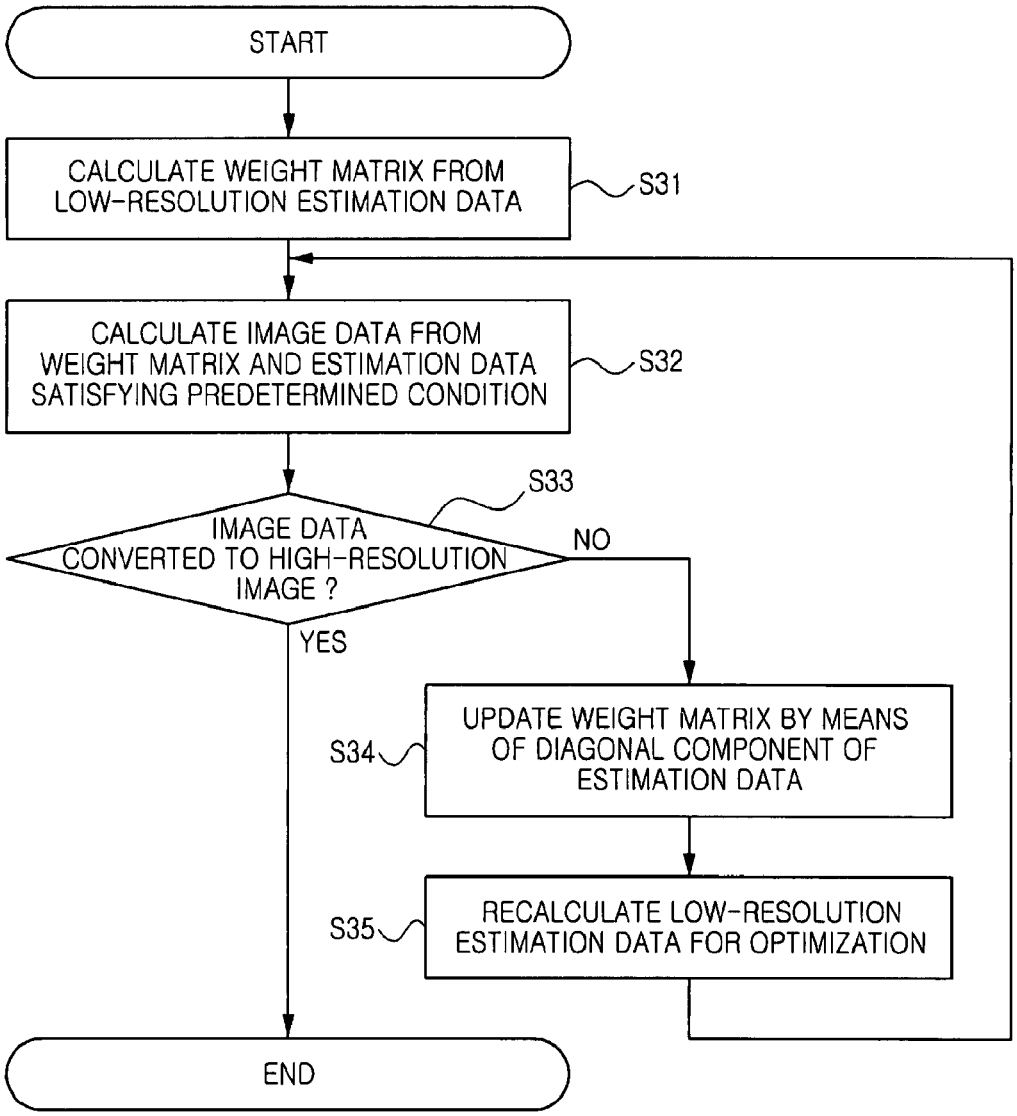
FIG. 2 is a flowchart schematically illustrating the FOCUSS algorithm according to the present invention.

Hereinafter, an exemplary embodiment of the present invention will be described with reference to the accompanying drawings. In the following description and drawings, the same reference numerals are used to designate the same or similar components, and so repetition of description of the same or similar components will be omitted.

FIG. 1 is a flowchart schematically illustrating a high-resolution image reconstruction method using the focal underdetermined system solver (FOCUSS) algorithm according to an exemplary embodiment of the present invention. As shown in FIG. 1, the high-resolution image reconstruction method using the FOCUSS algorithm according to an exemplary embodiment of the present invention starts with a step of obtaining downsampled data.

The downsampled data is transformed into a low-resolution initial estimation for sparse data. In this case, when the sampled data corresponds to radial projection data, an inverse Radon transformation is applied to transform the radial data into a low-resolution initial estimation, and when the output data corresponds to random or spiral data, an inverse Fourier transform is applied to transform the random or spiral data into a low-resolution initial estimation.

Additionally, with respect to a moving image, a Fourier transform is applied along the time axis, thereby obtaining an initial estimation for sparser data.

Also, a high-resolution image is reconstructed by applying the FOCUSS algorithm to the low-resolution initial estimation, to which the inverse Radon transformation or inverse Fourier transform has been applied, wherein image data is calculated by multiplying the low-resolution initial estimation by a weighting matrix of a predetermined condition.

In this step, when the image data is converged to an optimized high-resolution image, the procedure ends.

On the other hand, when the image data is not converged to the optimized high-resolution image, the weighting matrix is updated with the diagonal values of a matrix which is obtained by applying to the absolute value of the estimation data matrix a power factor ranging from 0.5 to 1, the low-resolution estimation data is recalculated to be optimized, and the FOCUSS algorithm is repeatedly performed until the estimation data is converged to the optimized high-resolution image.

Data "v(k,t)" sampled as described above is transformed into a sparse signal "ρ(y,f)" by the Fourier transform, which is expressed as equation 1 below.

$$v(k,t)=\iint \rho(y,f)e^{-j2\pi(ky+ft)}dydf \qquad \text{Equation 1}$$

When it is assumed that the same data value is obtained regardless of "t," equation 1 corresponds to a magnetic resonance image signal acquisition equation for a still image. In contrast, when different data values are obtained depending on "t," equation 1 corresponds to a magnetic resonance image signal acquisition equation for a moving image.

Additionally, when an image obtained by photographing a periodically moving organ, such as a heart or brain blood flow, is Fourier transformed, a resultant spectrum is obtained in the form of Fourier series, so that a sparser signal for a moving image can be obtained by equation 1.

In this case, the reason why the sparse characteristic is important is that signals other than "0" of π(y,f) are not scattered in a sparse distribution but are concentrated on a position in order to apply a compressed sensing theory, and that it is possible to achieve complete reconstruction of sparse signals from much less samples than those required for the Nyquist sampling limit.

According to the compressed sensing theory, optimization is required to obtain a solution having a sparse characteristic, which in the case of the magnetic resonance imaging may be expressed as shown in equation 2 below.

$$\text{minimize } \|\pi\|_1$$

$$\text{subject to } \|v-F\pi\|_2 \le \epsilon \qquad \text{Equation 2}$$

Herein, "F" represents a transform for making sparse data, and may be a Fourier transform or Radon transformation, which is calculated for a solution having a sparse characteristic by using the FOCUSS algorithm. The FOCUSS algorithm is used to obtain a solution of a sparse form for an underdetermined linear equation having no determined solution.

$$v=F\rho \qquad \text{Equation 3}$$

When it is assumed that the F matrix has a size of K×N and the value of "N" is much greater than the value of "K," equation 1 has a large number of solutions. In this case, when a solution of equation 3 is determined to minimize the norm of "v," energy shows a tendency to spread, so that the sampling rate increases.

Therefore, in order to finally obtain a high-resolution image by reconstructing sparse data with a reduced sampling rate, an image reconstruction method using the FOCUSS algorithm according to an exemplary embodiment of the present invention is applied, which is approached as an optimization problem for solving equation 3 according to the FOCUSS algorithm.

Herein, a relation among image data "ρ" to be reconstructed, the weighting matrix "W," and the optimized solution "q" for the weighting matrix "W" is defined by equation 4.

$$\text{find } \rho=Wq$$

$$\min\|q\|_2 \text{ subject to } \|v-FWq\|_2 \le \epsilon \qquad \text{Equation 4}$$

In equation 4, "ρ" represents sparse data, "W" represents a weighting matrix having only diagonal elements, and "q" represents an optimized solution for the weighting matrix "W."

With respect to a still image, an initial substitution value of the weighting matrix may be calculated through a pseudo inverse matrix, in which when the sampled data corresponds to radial projection data, an inverse Radon transformation is applied to transform the radial data into a low-resolution initial estimation, and when the output data corresponds to random or spiral data, an inverse Fourier transform is applied to transform the random or spiral data into a low-resolution initial estimation.

Also, with respect to a moving image, the output data is subjected to an inverse Fourier transform of "k" in k space, and is then transformed into low-resolution image data, thereby being arranged in terms of time. When the resultant data is subjected to a Fourier transform in terms of time, image frequency data in the frequency domain is obtained. In order to concentrate the image frequency data around "0" in a k domain, all data during one period in a frequency encoding direction is obtained in a $k_x$ direction, and data having different random patterns depending on periods in a phase encoding direction is obtained in a $k_y$ direction. Also, DC data corresponding to a time frequency of "0" in a y-f domain calculated as above is set to be "0," and initial data to be substituted into the weighting matrix "W" is calculated (step 31).

Then, diagonal elements of initial data calculated in step 31 are substituted into an initial weighting matrix "W," and a resultant weighting matrix is multiplied by low-resolution image data "q" which is an optimal solution for a given weighting matrix, thereby calculating image data "ρ" (step 32).

Then, a step of checking whether or not the calculated image data "ρ" is converged to the high-resolution image is performed (step 33). When the calculated image data "ρ" is converged near the high-resolution image by one iteration, the procedure ends. In contrast, when the calculated image data "ρ" is not converged to the high-resolution image, the weighting matrix "W" is updated with diagonal elements of a matrix which is obtained by raising the absolute value of the calculated image data "ρ" to the power of 0.5 (step 34), for a higher-resolution image is obtained as the iteration performance is repeated.

Herein, it is preferred that the exponent of the absolute value of the calculated image data "ρ" has a value within a range of 0.5 to 1.

Next, the low-resolution image data "q" is recalculated to be an optimal solution (step 35).

Then, when the calculated image data "ρ" is converged to the high-resolution image, if the procedure is to obtain a still image, the procedure ends after the calculated image has been obtained, and if the procedure is to obtain a moving image, the calculated image is subjected to an inverse Fourier transform along the time axis so that a time-based image can be reconstructed and then the procedure ends.

In this case, by using a Lagrangian parameter, equation 4 may be rewritten as equation 5.

$$C(q)=\|v-FWq\|_2^2+\lambda\|q\|_2^2 \qquad \text{Equation 5}$$

When equation 5 is solved, an optimal solution is calculated as shown in equation 6.

$$\begin{aligned}\rho &= Wq \qquad \text{Equation 6}\\ &= \Theta F^H(F\Theta F^H+\lambda I)^{-1}v \ (\text{where } \Theta = WW^H)\end{aligned}$$

The advantage of the FOCUSS algorithm according to the present invention is to converge calculated image data to high-resolution image data "ρ" by updating a weighting matrix "W," in which when steps 32 to 35 in the FOCUSS algorithm according to the present invention are repeated (n−1) times, image data "ρ" is expressed as follows.

$$\rho_{n-1}=[\rho_{n-1}(1), \rho_{n-1}(2), \ldots, \rho_{n-1}(N)]^T \qquad \text{Equation 7}$$

Then, the weighting matrix "W" updated with the components of the image data "ρ" is expressed as follows.

$$W_n = \begin{pmatrix} |\rho_{n-1}(1)|^P & 0 & \ldots & 0 \\ 0 & |\rho_{n-1}(2)|^P & \ldots & 0 \\ \vdots & \vdots & \ddots & \vdots \\ 0 & 0 & \ldots & |\rho_{n-1}(N)|^P \end{pmatrix} \qquad \text{Equation 8}$$

When equation 6 is applied to the weighting matrix "W" updated as equation 8, a solution gradually having a sparse characteristic is obtained.

Equation 4 may be expressed as follows.

$$\min\|W_n^{-1}\rho\|_2^2, \text{ subject to } \|v-FWq\|_2 \le \varepsilon, \qquad \text{Equation 9}$$

wherein when $p = 0.5$, $$\begin{aligned}\|W_n^{-1}\rho\|_2^2 &= \rho^H W_n^{-H} W_n^{-H}\rho\\ &= \rho^H \begin{pmatrix} |\rho_{n-1}(1)|^P & 0 & \ldots & 0 \\ 0 & |\rho_{n-1}(2)|^P & \ldots & 0 \\ \vdots & \vdots & \ddots & \vdots \\ 0 & 0 & \ldots & |\rho_{n-1}(N)|^P \end{pmatrix}\rho\\ &\approx \sum_{i=1}^{N}|\rho_{n-1}(i)| \text{ as } n\to\infty\\ &= \|\rho\|_1\end{aligned}$$

This means that the solution obtained by the FOCUSS algorithm becomes gradually equal to the optimal solution, and that the solution obtained by the FOCUSS algorithm is gradually converged to a high-resolution image which is an optimized solution in terms of compressed sensing theory.

This is because it is said that compressed sensing theory can successfully obtain a solution having a sparse characteristic.

The FOCUSS algorithm according to the present invention can obtain an accurate result based on the compressed sensing theory, by setting the exponent to be "0.5" and repeating steps 34 and 35 several times.

Meanwhile, with respect to such a result, parallel coils can be used to apply the FOCUSS algorithm according to the present invention, and equation 5 may be rewritten in terms of multiple coils as follows.

$$C(q) = \|v' - F'W_n q\|_2^2 + \lambda\|q\|_2^2 \qquad \text{Equation 10}$$

$$\text{where } v' = [v_1 \ \vdots \ v_{N_c}], \quad F' = [FS_1 \ \vdots \ FS_{N_c}]$$

$$\rho_n = \Theta_n F'^H(F'\Theta_n F'^H + \lambda I)^{-1}v' \qquad \text{Equation 11}$$

The solution of equation 10 is calculated as equation 11, in which even when multiple coils are used, a result approximating to a high-resolution image can be obtained by setting the exponent to be "0.5" and repeating the steps.

Based on this, the FOCUSS algorithm according to the present invention is applied to each coil, and results as many as coils yielding a result are obtained by means of the least squares method, thereby obtaining a final result, which is expressed as equation 12 below.

$$\min\|y_i' - S_i\rho\|_2^2 \qquad \text{Equation 12}$$

$$\rho = \left(\sum_{i=1}^{N_c} S_i S_i^H\right)^{-1}\left(\sum_{i=1}^{N_c} S_i^H y_i'\right)$$

In addition, the FOCUSS algorithm according to the present invention may be applied to various data, which can be achieved through the Fourier transform of equation 5.

Meanwhile, referring to FIG. 1, random sampling of downsampled data corresponds to Gaussian random sampling, and low-resolution image data "q" satisfying a predetermined condition in step 32 is calculated by means of the Lagrangian, wherein when the Fourier transform of a predetermined condition transformed by the Lagrangian is replaced by a Fourier transform applied along a time axis and a Radon transformation, the FOCUSS algorithm can be applied to radial data. Herein, the radial data must satisfy a condition that the radial data is downsampled at a uniform angle.

In addition, the low-resolution image data satisfying a predetermined condition in step 32 is calculated by means of the Lagrangian, as described above, wherein when Fourier transform of a predetermined condition transformed by the Lagrangian is replaced by a Fourier transform applied along a time axis and a Radon transformation, the FOCUSS can be applied to spiral data. Herein, the spiral data must satisfy a condition that the spiral data is downsampled at a uniform angle.

As described above, the FOCUSS algorithm according to the present invention can reconstruct even radial data and spiral data to a high-resolution image.

The FOCUSS algorithm according to the present invention can reconstruct an image from a very small amount of data, thereby reducing the scan time period. This means that it is possible to improve the time resolution, which is very important for both still and moving images.

Because minimum TR of MRI is limited, there are limitations for temporal resolution in conventional MRI. Even when a still image is obtained, it is impossible to completely rule out movement caused during scanning of a living thing. In addition, as scan time period becomes longer, an obtained still image becomes more blurry due to movement, thereby making it difficult to correctly reconstruct an image. Moreover, an image of a heart or cerebral blood flow is obtained for the purpose of observing a change in the image according to time. Therefore, when the scan time period becomes longer, time resolution between frames becomes worse, so that it is impossible to correctly observe the movement of a targeted thing.

The present invention provides a new algorithm which can overcome the limitation of the conventional magnetic resonance imaging (MRI), and the new algorithm is expected to provide a more correct image and to help to examine a patient.

Although an exemplary embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a high-resolution image *of an object*, the method comprising the steps of:

(a) *using a medical device for:*

(*a1*) *applying incident radiation to the object;*

(*a2*) *receiving response radiation from the object; and*

(*a3*) outputting data for an image of [an] *the* object *from the response radiation*;

(b) downsampling the outputted data *using the medical device*;

(c) transforming the downsampled data into low-resolution image frequency data *using the medical device*; [and]

(d) reconstructing [a], *using the medical device, the* high-resolution image from the transformed low-resolution image frequency data by applying *a* focal underdetermined system solver (FOCUSS) algorithm*; and*

(*e*) *displaying the high-resolution image using a display for providing the high-resolution image for examining the object.*

2. The method as claimed in claim 1, wherein, when the image is a still image, the outputted data corresponds to projection data obtained by a magnetic resonance imaging scheme, and the outputted data corresponds to radial data, the step (c) is performed by inverse Radon transformation.

3. The method as claimed in claim 1, wherein, when the image is a still image and the outputted data corresponds to spiral data, the step (c) is performed by inverse Fourier transformation.

4. The method as claimed in claim 1, wherein, when the image is a moving image, the method is performed in k-t space.

5. The method as claimed in claim 4, wherein the step (b) is performed by obtaining all data in a frequency encoding direction during a predetermined period in a time domain and random-pattern data in a phase encoding direction according to each period.

6. The method as claimed in claim 4, wherein the step (c) is performed by two-dimensional Fourier transformation.

7. The method as claimed in claim 1, wherein the step (d) further comprise the steps of:

(1) calculating a weighting matrix from the low-resolution image frequency data;

(2) calculating image data from the weighting matrix and the low-resolution image frequency data satisfying a predetermined condition; and (3) when the image data is converged the high-resolution image, performing inverse Fourier transformation along a time axis to reconstruct the high-resolution image; or when the image data is not converged, updating the weighting matrix by using a diagonal element of the image data and repeating the step (2) with the updated weighting matrix until the image data is converged to the high-resolution image.

8. The method as claimed in claim 7, wherein the low-resolution image frequency data satisfying a predetermined condition in the step (2) is calculated by Lagrangian transformation.

9. The method as claimed in claim 8, wherein when a Fourier transform transformed by the Lagrangian transformation is replaced by a Fourier transform applied along a time axis and Radon transformation, the FOCUSS algorithm is applied with respect to radial data in k or k-t space.

10. The method as claimed in claim 9, wherein the radial data corresponds to downsampled data obtained at a uniform angle.

11. The method as claimed in claim 8, wherein when a Fourier transform transformed by the Lagrangian transformation is replaced by a Fourier transform applied along a time axis and Radon transformation, the FOCUSS algorithm is applied with respect to spiral data in k or k-t space.

12. The method as claimed in claim 11, wherein the spiral data corresponds to downsampled data obtained at a uniform angle.

13. The method as claimed in claim 7, wherein the updating of weighting matrix in the step (3) is performed by applying a power factor to absolute value of the diagonal element.

14. The method as claimed in claim 13, wherein the power factor is *in the range of* 0.5 to 1.

*15. A method for forming a high-resolution image of an object, the method comprising the steps of:*

(*a*) *downsampling data representative of an image of the object at a rate lower than Nyquist sampling rate, the downsampled data being received from the object after applying incident radiation to the object using a medical device;*

(*b*) *transforming the downsampled data into low-resolution initial estimation data using the medical device applying a transformation to the downsampled data;*

(*c*) *reconstructing, using the medical device, the high-resolution image from the transformed low-resolution initial estimation data by applying a focal underdetermined system solver (FOCUSS) algorithm; and*

(*d*) *displaying the high-resolution image using a display for providing the high-resolution image for examining the object.*

*16. The method as claimed in claim 15, wherein, when the image is a still image, the data representative of the image corresponds to projection data obtained by a magnetic resonance imaging scheme, and the data representative of the image corresponds to radial data, the step (b) is performed by inverse Radon transformation.*

*17. The method as claimed in claim 15, wherein, when the image is a still image and the data representative of the image corresponds to spiral data, the step (b) is performed by inverse Fourier transformation.*

*18. The method as claimed in claim 15, wherein, when the image is a moving image, the method is performed in k-t space or k space.*

*19. The method as claimed in claim 18, wherein the step (a) is performed by obtaining all data in a frequency encoding direction during a predetermined period in a time domain and sparse data in a phase encoding direction according to each period.*

*20. The method as claimed in claim 18, wherein the step (b) is performed by a two-dimensional Fourier transformation.*

*21. The method as claimed in claim 15, wherein the step (c) further comprises the steps of: (1) calculating a weighting matrix from the low-resolution initial estimation data; (2) calculating image data from the weighting matrix and the low-resolution initial estimation data satisfying a predetermined condition; and (3) if the calculated image data of step (2) is convergent into the high-resolution image, performing an inverse Fourier transformation along a time axis to reconstruct the high-resolution image; and if the calculated image data is not convergent into the high-resolution image, updating the weighting matrix by using a diagonal element of the initial estimation data and repeating the step (2) with the updated weighting matrix until the calculated image data is convergent into the high-resolution image, and performing an inverse Fourier transformation along a time axis to reconstruct the high-resolution image.*

*22. The method as claimed in claim 21, wherein the low-resolution initial estimation data satisfying a predetermined condition in the step (2) is calculated by a Lagrangian transformation.*

*23. The method as claimed in claim 22, wherein the FOCUSS algorithm is applied with respect to radial or spiral data in k or k-t space.*

*24. The method as claimed in claim 23, wherein the radial or spiral data corresponds to the downsampled data obtained at a uniform angle.*

*25. The method as claimed in claim 21, wherein the updating of weighting matrix in the step (3) is performed by applying a power factor to an absolute value of the diagonal element of the initial estimation data.*

*26. The method as claimed in claim 25, wherein the power factor is in the range of 0.5 to 1.*

*27. The method as claimed in claim 15, wherein for a still image the step (c) further comprises the steps of: (1) calculating a weighting matrix from the low-resolution initial estimation data; (2) calculating image data from the weighting matrix and the low-resolution initial estimation data satisfying a predetermined condition; and (3) if the calculated image data of step (2) is convergent into the high-resolution image, providing the calculated image data as the high-resolution image; and if the calculated image data is not convergent into the high-resolution image, updating the weighting matrix by using a diagonal element of the initial estimation data and repeating the step (2) with the updated weighting matrix until the calculated image data is convergent into the high-resolution image.*

*28. The method as claimed in claim 15, wherein for a moving image the step (c) further comprises the steps of: (1) calculating a weighting matrix from the low-resolution initial estimation data; (2) calculating image data from the weighting matrix and the low-resolution initial estimation data satisfying a predetermined condition; and (3) if the calculated image data of step (2) is convergent into the high-resolution image, performing an inverse Fourier transformation of the calculated image data along a time axis to reconstruct the high-resolution image; and if the calculated image data is not convergent into the high-resolution image, updating the weighting matrix by using a diagonal element of the initial estimation data and repeating the step (2) with the updated weighting matrix until the calculated image data is convergent into the high-resolution image.*

*29. A magnetic resonance imaging apparatus comprising:*

*a medical device for downsampling data representative of an image of the object at a rate lower than Nyquist sampling rate, the downsampled data being received from the object after applying incident radiation to the object using a medical device; transforming the downsampled data into low-resolution initial estimation data by applying a transformation to the downsampled data; and reconstructing a high-resolution image from the transformed low-resolution initial estimation data by applying a focal underdetermined system solver (FOCUSS) algorithm; and*

*a display for displaying the high-resolution image for providing the high-resolution image for examining the object.*

*30. A method for forming a high-resolution image of an object, the method comprising the steps of:*

(*a*) *downsampling data representative of an image of the object at a rate lower than Nyquist sampling rate, the downsampled data being received from the object after applying incident radiation to the object using a medical device;*

(*b*) *transforming the downsampled data into low-resolution initial estimation data using the medical device applying a transformation to the downsampled data;*

(*c*) *reconstructing, using the medical device, the high-resolution image from the transformed low-resolution initial estimation data by applying a sparse recovery algorithm to the low-resolution initial estimation data, which algo-*

*rithm multiplies the low-resolution initial estimation data by a weighting factor; and*

*(d) displaying the high-resolution image using a display for providing the high-resolution image for examining the object.*

*31. The method as claimed in claim 30, wherein the step (c) further comprises the steps of: (1) calculating the weighting matrix from the low-resolution initial estimation data; (2) calculating image data from the weighting matrix and the low-resolution initial estimation data satisfying a predetermined condition; and (3) if the calculated image data of step (2) is convergent into the high-resolution image, performing an inverse Fourier transformation along a time axis to reconstruct the high-resolution image; and if the calculated image data is not convergent into the high-resolution image, updating the weighting matrix by using a diagonal element of the initial estimation data and repeating the step (2) with the updated weighting matrix until the calculated image data is convergent into the high-resolution image, and performing an inverse Fourier transformation along a time axis to reconstruct the high-resolution image.*

*32. A magnetic resonance imaging apparatus comprising:*

*a medical device for downsampling data representative of the image of the object at a rate lower than Nyquist sampling rate, the downsampled data being received from the object after applying incident radiation to the object using a medical device; transforming the downsampled data into low-resolution initial estimation data by applying a transformation to the downsampled data; and reconstructing a high-resolution image from the transformed low-resolution initial estimation data by applying a sparse recovery algorithm to the low-resolution initial estimation data, which algorithm multiplies the low-resolution initial estimation data by a weighting factor; and*

*a display for displaying the high-resolution image for providing the high-resolution image for examining the object.*

*33. A method for processing dynamic image data obtained from a magnetic resonance imaging (MRI) apparatus, for forming a high resolution moving image of at least a portion of a living subject, the method comprising the following steps:*

*(a) downsampling a set of data representative of an moving image of the moving object from the response radiation at a rate lower than Nyquist sampling rate, the downsampled data being received from the object after applying incident radiation to the object using a medical device;*

*(b) transforming the downsampled data into low-resolution initial estimation data using the medical device applying a transformation to the downsampled data;*

*(c) reconstructing, using the medical device, the high-resolution moving image from the transformed low-resolution initial estimation data by applying a sparse recovery algorithm to the low-resolution initial estimation data, which algorithm multiplies the low-resolution initial estimation data by a weighting factor; and*

*(d) displaying the high-resolution moving image using a display for providing the high-resolution moving image for examining the moving object.*

*34. The method as claimed in claim 33, wherein the dynamic image data is representative of blood flow as the moving object in the portion of a living subject imaged by the MRI apparatus.*

*35. The method as claimed in claim 33, wherein the dynamic image data is representative of a beating heart as the moving object in the living subject imaged by the MRI apparatus.*

*36. The method as claimed in claim 33, wherein the sparse recovery algorithm comprises a focal underdetermined system solver (FOCUSS) algorithm.*

*37. A magnetic resonance imaging apparatus for performing a high resolution image reconstruction on data representative of an image of an object, the magnetic resonance imaging apparatus comprising:*

*a medical device for downsampling a set of the data representative of the image of the object at a rate lower than Nyquist sampling rate, the downsampled data being received from the object after applying incident radiation to the object using a medical device; transforming the downsampled data into low-resolution initial estimation data by applying a transformation to the downsampled data; and reconstructing a high-resolution image from the transformed low-resolution initial estimation data by applying a sparse recovery algorithm to the low-resolution initial estimation data, which algorithm multiplies the low-resolution initial estimation data by a weighting factor; and*

*a display for displaying the high-resolution image for providing the high-resolution image for examining the object.*

*38. The magnetic resonance imaging apparatus of claim 37, wherein the sparse recovery algorithm comprises a focal underdetermined system solver (FOCUSS) algorithm.*

*39. A parallel imaging method for processing magnetic resonance imaging (MRI) data obtained by the use of multiple coils of an MRI apparatus, for forming a high resolution image of an object, the method comprising:*

*(a) down sampling a set of MRI data from each of a respective one of the multiple coils at a rate lower than Nyquist sampling rate, the downsampled data being received from the object after applying incident radiation to the object using a medical device, where each set of MRI data is representative of the object;*

*(b) transforming each of the down sampled data sets into low-resolution initial estimation data sets using the medical device applying a transformation to the obtained data sets; and*

*(c) reconstructing, using the medical device, the high-resolution image from the transformed low-resolution initial estimation data sets by applying a sparse recovery algorithm to the low-resolution initial estimation data, which algorithm multiplies the low-resolution initial estimation data by a weighting factor; and*

*(d) displaying the high-resolution image using a display for providing the high-resolution image for examining the object.*

*40. The method as claimed in claim 39, wherein the sparse recovery algorithm comprises a focal underdetermined system solver (FOCUSS) algorithm.*

*41. The method as claimed in claim 39, wherein the multiple coils are parallel coils.*

*42. The method as claimed in claim 15, wherein the transformation is selected from a Fourier transformation, an inverse Fourier transformation, a Radon transformation, and an inverse Radon transformation.*

* * * * *